(12) United States Patent
Hull et al.

(10) Patent No.: US 6,469,596 B2
(45) Date of Patent: Oct. 22, 2002

(54) ANNULAR COMPOSITE CAPACITOR/INDUCTOR WITH A SWITCH ACROSS THE GAP

(75) Inventors: Jonathan P. Hull; David W. Scholfield, both of Albuquerque, NM (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 29 days.

(21) Appl. No.: 09/742,503

(22) Filed: Dec. 20, 2000

(65) Prior Publication Data

US 2002/0118077 A1 Aug. 29, 2002

(51) Int. Cl.$^7$ .............................. H03H 7/01; H03H 5/02
(52) U.S. Cl. ...................... 333/185; 333/175; 333/219
(58) Field of Search ................................. 333/175, 185, 333/219; 361/270, 301.4

(56) References Cited

U.S. PATENT DOCUMENTS 4,812,791 A * 3/1989 Makimoto et al. .......... 333/219

FOREIGN PATENT DOCUMENTS

JP 06314917 A * 11/1994 .................. 333/219

OTHER PUBLICATIONS

A. C. Doty, Jr. et al., "Introducing the Incons," OST, p. 11–14, Feb. 1979.

Frederick W. Grover, Inductance Calculations: Working Formulas and Tables, Dover, 1962.

* cited by examiner

*Primary Examiner*—Justin P. Bettendorf
(74) *Attorney, Agent, or Firm*—James M. Skorich; Kenneth E. Callahan

(57) ABSTRACT

A composite capacitor/inductor assembly has been developed that merges the capacitance utilized for energy storage into the inductor, creating a consolidated electrical component. The composite capacitor/inductor is capable of functioning in those applications requiring resonant circuits for frequencies in excess of 100 MHz. The composite nature of the device reduces by one-half the number of components required to produce a resonant circuit.

2 Claims, 6 Drawing Sheets

ANNULAR COMPOSITE CAPACITOR/INDUCTOR WITH A SWITCH ACROSS THE GAP

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

1. Field of the Invention

The invention is in the field of electrical components, and in particular relates to composite capacitor/inductor resonant circuits.

2. Description of the Prior Art

Resonant circuits use inductive and capacitive components. Twenty years ago these two components were combined using two coils. A second coil, having a diameter somewhat smaller than a first coil, was partially inserted axially inside the first coil. The inductance of the windings plus the capacitance between the windings was used to develop a series resonant circuit that did not require a separate capacitor. (See A. C. Doty, Jr. et al., "Introducing the Incons," OST, p. 11-14, February 1979, and U. S. Pat. Nos. 3,980,975, 4,128,818, and 4,236,127.)

SUMMARY OF THE INVENTION

A composite capacitor/inductor resonant circuit is described employing alternate layers of conducting annuli and insulating annuli, coaxially positioned. Each annulus has a gap circumferentially positioned to provide a location for the primary inductor switch. The switch is connected to opposing ends of the separate annuli. Conceptually this arrangement forms a parallel plate transmission line with a switch positioned across the opposing ends. At resonance, the distributed circuit behaves as a lumped inductor and capacitor.

BRIEF DESCRIPTION OF THE DRAWINGS

The various features of novelty that characterize the invention are pointed out with particularity in the claims annexed to and forming a part of this disclosure. For a better understanding of the invention, its operating advantages, and specific objects attained by its uses, reference is made to the accompanying drawings and descriptive matter in which a preferred embodiment of the invention is illustrated.

FIG. 1b shows a cross-sectional view of FIG. 1a.

versus the number of annuli, N, for various values of the coupling coefficient, k.

DESCRIPTION OF THE PREFERRED EMBODIMENT

Resonant circuits have typically been designed using lumped element capacitors for energy storage, separate from the inductor. Composite capacitor/inductor assemblies are of interest due to the ability of these devices to produce resonant responses with one half the number of parts required for more traditional resonant circuits. Previous construction strategies have interwoven the coils of inductors.

Figure 1A:
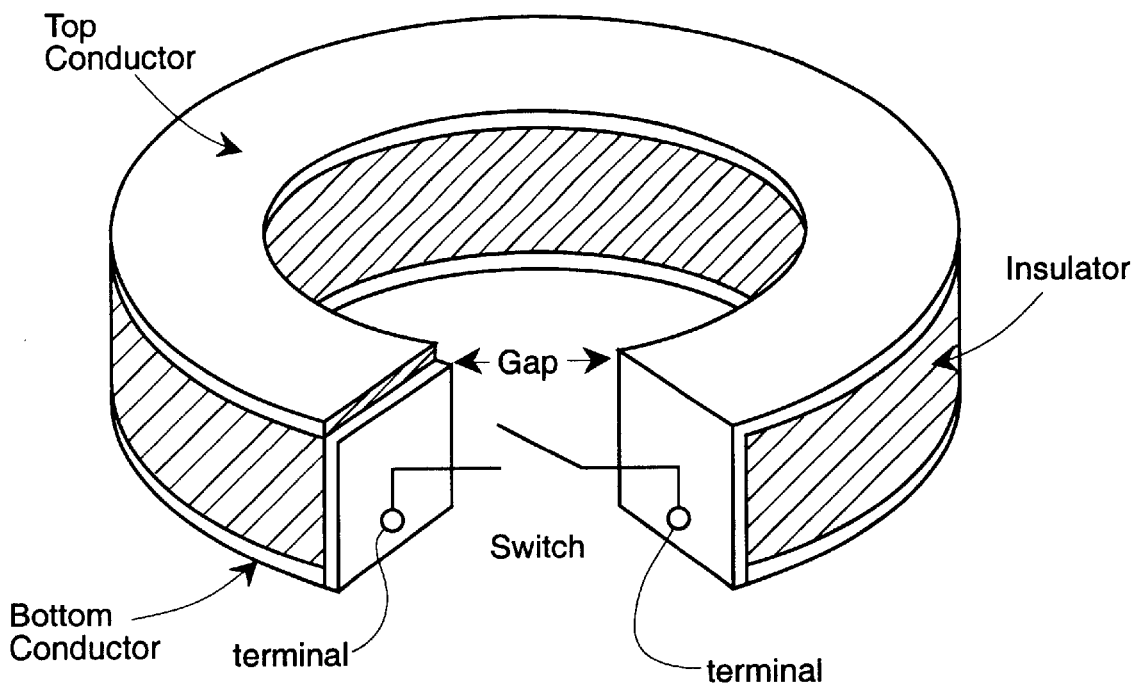
FIG. 1a shows an oblique view of the composite capacitor/inductor of the present invention with two annuli required to form a single capacitor/inductor.
Figure 1B:
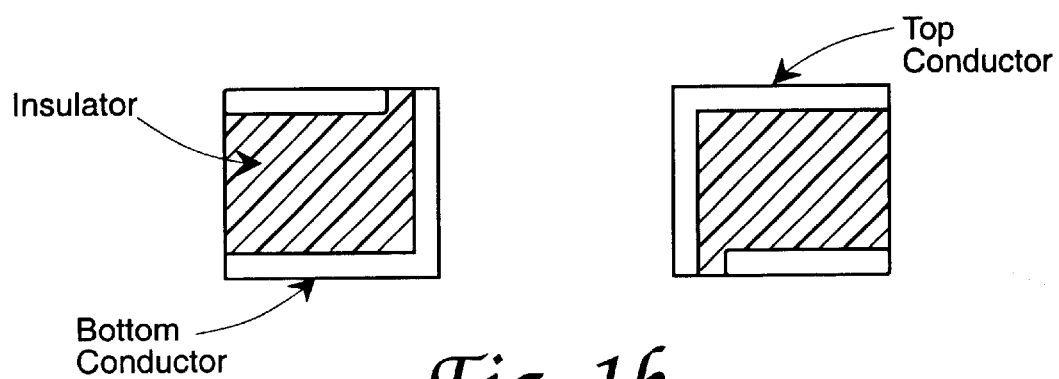

The present invention combines the capacitance with the inductance by employing conducting annuli, coaxially positioned, such that the annuli function as both capacitor and inductor. Referring to FIG. 1a and 1b, each annulus has a gap circumferentially located to provide a location for the primary inductor switch. The switch is connected to opposing ends of the separate annuli. In FIG. 1a the top conductor annulus extends down into the gap. Similarly, the bottom conductor annulus extends up into the gap on the opposite side. These two conductors are electrically isolated by the insulator annulus and the gap except when connected via the switch.

Figure 2A:
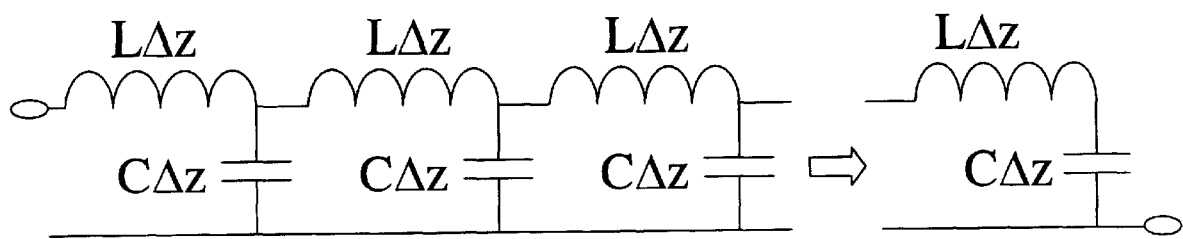
FIG. 2a is a distributed circuit representation of the composite capacitor/inductor of FIG. 1.
Figure 2B:
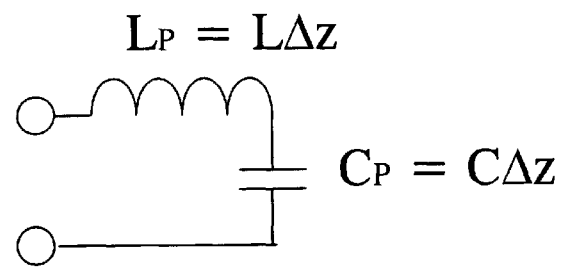
FIG. 2b is a distributed circuit representation of the composite capacitor/inductor of FIG. 1 at resonance wherein it behaves as a lumped inductor and capacitor.

Conceptually this arrangement forms a parallel plate transmission line with a switch positioned across the opposing ends. A distributed circuit representation for this geometry is shown in FIG. 2a. At resonance, the distributed circuit behaves as a lumped inductor and capacitor with the resultant simple equivalent circuit shown in FIG. 2b.

Figure 3A:
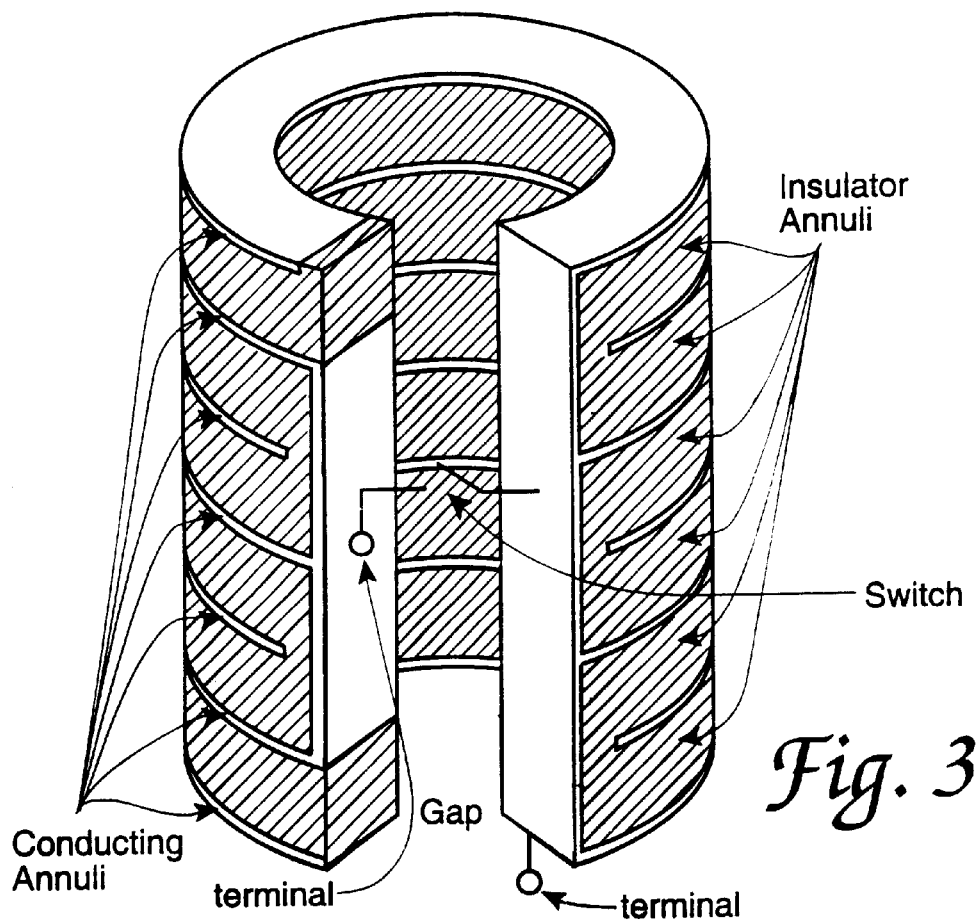
FIG. 3 shows an oblique view (3a) and a cross-sectional view (3b) of a composite capacitor/inductor composed of a stack of N annuli.
Figure 3B:
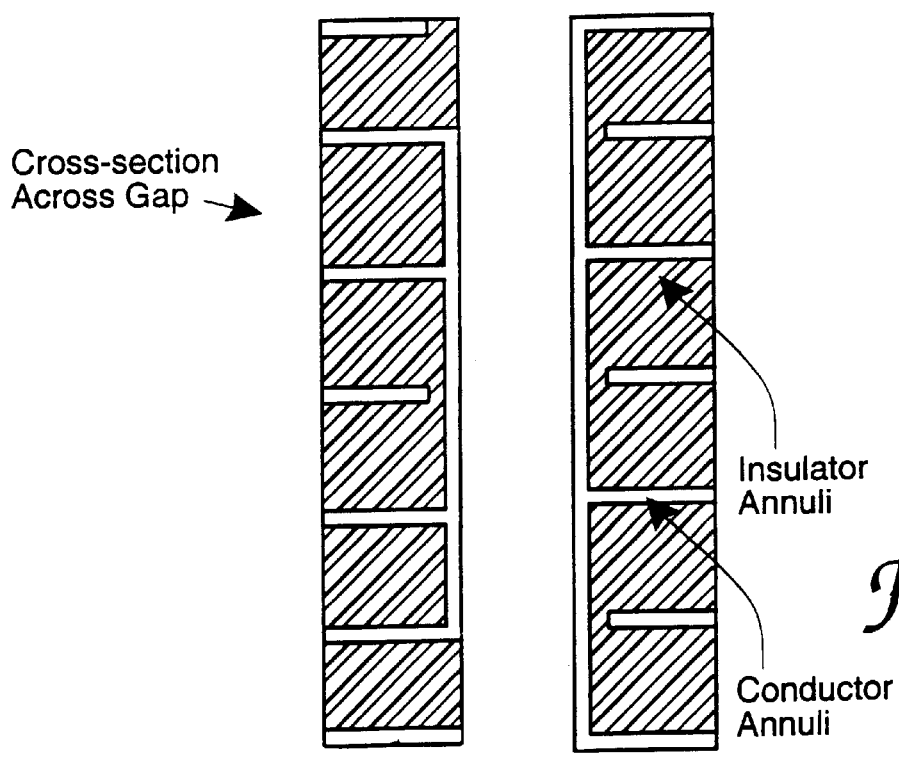

Two conducting annuli are required to form one capacitor/inductor. For a stack of N conducting annuli, see FIG. 3, N−1 capacitor/inductor rings are formed. The top conductor annulus (number 1 counting from the top of the stack) is electrically connected to every odd-numbered conducting annulus in the stack via a conductor extending along one side of the gap. The even-numbered conducting annuli in the stack are similarly electrically connected via a conductor extending along the opposite side of the gap. A switch connects the two gap conductors. Insulator annuli separate and isolate the odd and even conducting annuli.

Figure 4:
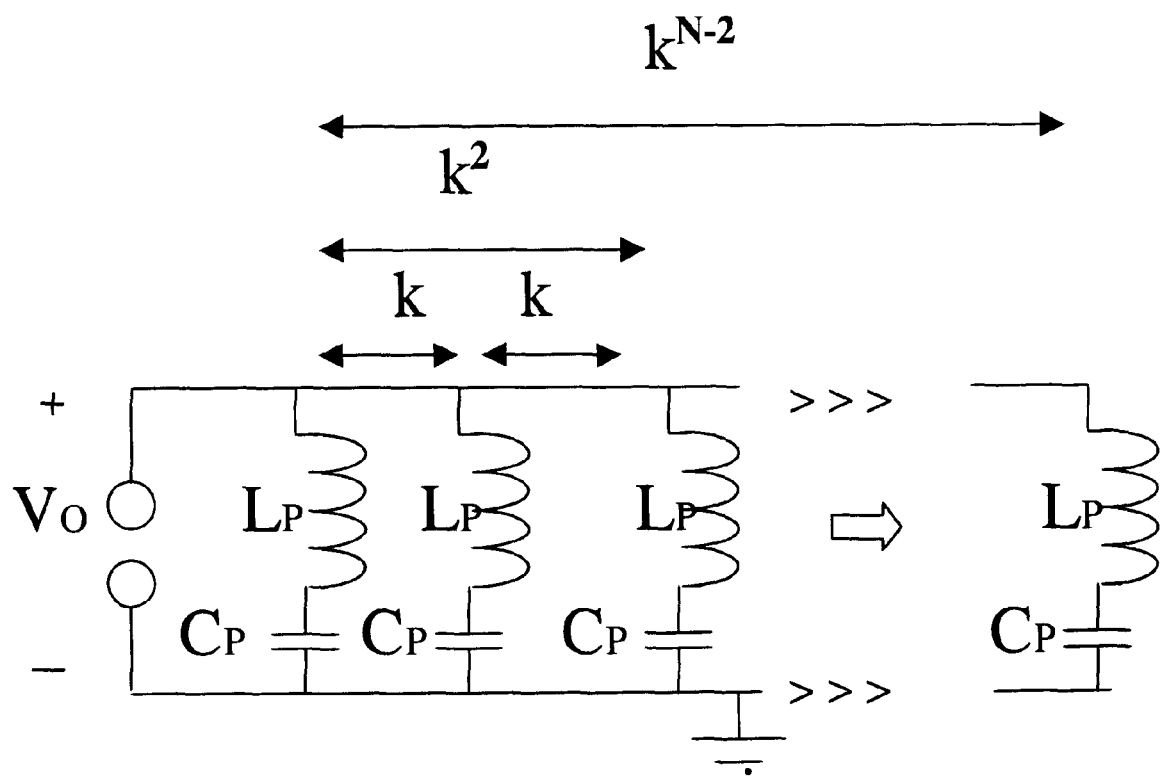
FIG. 4 is an equivalent circuit for the stack of N annuli of FIG. 3 with N−1 capacitor/inductor rings.

Magnetic coupling from inductor to inductor must be taken into account. The equivalent circuit for a stack of N annuli, with N−1 capacitor/inductor rings, is shown in FIG. 4. A value of $L_p$ is assigned to each inductor, and each capacitor has an assigned value of $C_p$. The circuit is assumed to have an initial voltage of $V_o$. The coupling coefficient between adjacent inductors is annotated as k, a value that is constrained to be between 0 and 1. The coupling coefficient between nonadjacent inductors will be approximated as the product of the coupling coefficients of the adjacent inductors separating any two nonadjacent inductors. Hence the coupling coefficient between the first and the third lumped inductors will be $k^2$, the coupling coefficient between the first and the fifth lumped inductors will be $k^4$, the coupling coefficient between the second and the seventh lumped inductors will be $k^5$, etc. After the switch has closed the equations describing the voltages, $V_i(t)$, across each i-th inductor can be shown to be $$V_1(t) = L_P \frac{d}{dt} I_1 + kL_P \frac{d}{dt} I_2 + k^2 L_P \frac{d}{dt} I_3 + \cdots + k^{N-2} L_P \frac{d}{dt} I_{N-1}$$

$$V_2(t) = kL_P \frac{d}{dt} I_1 + L_P \frac{d}{dt} I_2 + kL_P \frac{d}{dt} I_3 + \cdots + k^{N-3} L_P \frac{d}{dt} I_{N-1}$$

$$V_3(t) = k^2 L_P \frac{d}{dt} I_1 + kL_P \frac{d}{dt} I_2 + L_P \frac{d}{dt} I_3 + \cdots + k^{N-4} L_P \frac{d}{dt} I_{N-1}$$

$$\vdots$$

$$V_{N-1}(t) = k^{N-2} L_P \frac{d}{dt} I_1 + k^{N-3} L_P \frac{d}{dt} I_2 + k^{N-4} L_P \frac{d}{dt} I_3 + \cdots + L_P \frac{d}{dt} I_{N-1}$$

for values of i equal from 1 to N-1. The current flowing through each inductor will be governed by the current flowing through each capacitor located in series with that inductor. Substitution yields $$V_1(t) = -L_P C_P \frac{d^2}{dt^2} V_1(t) - kL_P C_P \frac{d^2}{dt^2} V_2(t) - \quad (2)$$

$$k^2 L_P C_P \frac{d^2}{dt^2} V_3(t) - \cdots - k^{N-2} L_P C_P \frac{d^2}{dt^2} V_{N-1}(t)$$

$$V_2(t) = -kL_P C_P \frac{d^2}{dt^2} V_1(t) - L_P C_P \frac{d^2}{dt^2} V_2(t) -$$

$$kL_P C_P \frac{d^2}{dt^2} V_3(t) - \cdots - k^{N-3} L_P C_P \frac{d^2}{dt^2} V_{N-1}(t)$$

$$V_3(t) = -k^2 L_P C_P \frac{d^2}{dt^2} V_1(t) - kL_P C_P \frac{d^2}{dt^2} V_2(t) -$$

$$L_P C_P \frac{d^2}{dt^2} V_3(t) - \cdots - k^{N-4} L_P C_P \frac{d^2}{dt^2} V_{N-1}(t)$$

$$\vdots$$

$$V_{N-1}(t) = -k^{N-2} L_P C_P \frac{d^2}{dt^2} V_1(t) - k^{N-3} L_P C_P \frac{d^2}{dt^2} V_2(t) -$$

$$k^{N-4} L_P C_P \frac{d^2}{dt^2} V_3(t) - \cdots - L_P C_P \frac{d^2}{dt^2} V_{N-1}(t)$$

Via Laplacian Transformations and Cramer's Rule it is shown that: $V_1(t)=V_{N-1}(t)$, $V_2(t)=V_{N-2}(t)$, $V_3(t)=V_{N-3}(t)$, etc. For closely coupled inductors, $k\approx1.0$, the voltages across all inductors may be set equal to one another. Equations 2 then simplify to $$V(t) = -(1 + k + k^2 + \cdots + k^{N-2}) L_P C_P \frac{d^2}{dt^2} V(t) \quad (3)$$

Yielding $$V(t) = -\left(\frac{1 - k^{N-1}}{1 - k}\right) L_P C_P \frac{d^2}{dt^2} V(t) \quad (4)$$

Equation 4 is easily recognized as that of a resonant circuit.
Define the effective resonant frequency, $\omega_{\it{eff}}$, for Equation 4 as $$\omega_{\it{eff}}^2 = \left(\frac{1-k}{1-k^{N-1}}\right)\omega_O^2 \quad (5)$$

where $$\omega_O = \frac{1}{\sqrt{L_P C_P}}.$$

With each additional annuli the capacitance of the system increases by an amount $C_p$, hence increasing the stored energy.

The total capacitance of the device, to be known as the effective capacitance, $C_{\it{eff}}$, is then $$C_{\it{eff}} = (N-1)C_p \quad (6)$$

For Equations 4, 5, and 6 to remain consistent it is then necessary to define a quantity to be known as the effective inductance, $L_{\it{eff}}$, as $$L_{\it{eff}} = \left(\frac{1-k^{N-1}}{1-k}\right)\frac{L_P}{(N-1)} \quad (7)$$

Equation 7 implies that additional annuli tend to decrease the effective inductance for a closely coupled system for values of k much less than 1. For values of $k\approx1$ equation 7 may be approximated as $L_{\it{eff}}=L_p$.

Equation 5 may now be rewritten as $$\omega_{\it{eff}}^2 = \frac{1}{L_{\it{eff}} C_{\it{eff}}} = \left(\frac{1-k}{1-k^{N-1}}\right)\omega_O^2 \quad (8)$$

Equation 8 suggests that the effective resonant frequency for a stack of N annuli decreases as the square root of the bracketed quantity on the left hand side.

Four composite capacitor/inductor devices have been constructed. The conducting elements for the devices were manufactured from 5-mil (0.127mm) copper tape. The first capacitor/inductor device was assembled with an exterior radius of 1.0 cm. The interior radius was 0.5 cm. The insulator between each conducting element consisted of a sheet of 0. 127mm thick paper. A gap 0.08-cm wide was cut into each annulus radially inward to accommodate electrical connections, and to produce the inductive loop. The capacitance and resonant frequency for this device was measured, yielding 34 pF and 865 MHz respectively. Calculated inductance for this device 995 pH.

The second capacitor/inductor device was assembled with an exterior radius of 0.5 cm. The interior radius was 0.25 cm. The insulator between each conducting element consisted of a sheet of 0. 127 mm thick paper. A gap 0.08-cm wide was cut into each annulus radially inward to accommodate electrical connections, and to produce the inductive loop. The capacitance and resonant frequency for this device was measured, yielding 17 pF and 2500 MHz respectively. Calculated inductance for this device 1090 pH.

The third capacitor/inductor device was assembled with a radius of 1.0 cm. with five annuli separated by approximately 0.32 cm. For this third device the copper tape was positioned to lay in the axial dimension at 1.0 cm. radius. The form to maintain the structure for the conducting elements consisted of two turns of a sheet of 0. 127 mm thick paper. The capacitance and resonant frequency for this device was measured, yielding 3.7 pF and 350 MHz respectively. Calculated inductance for this device 55.8 nH.

Figure 5:
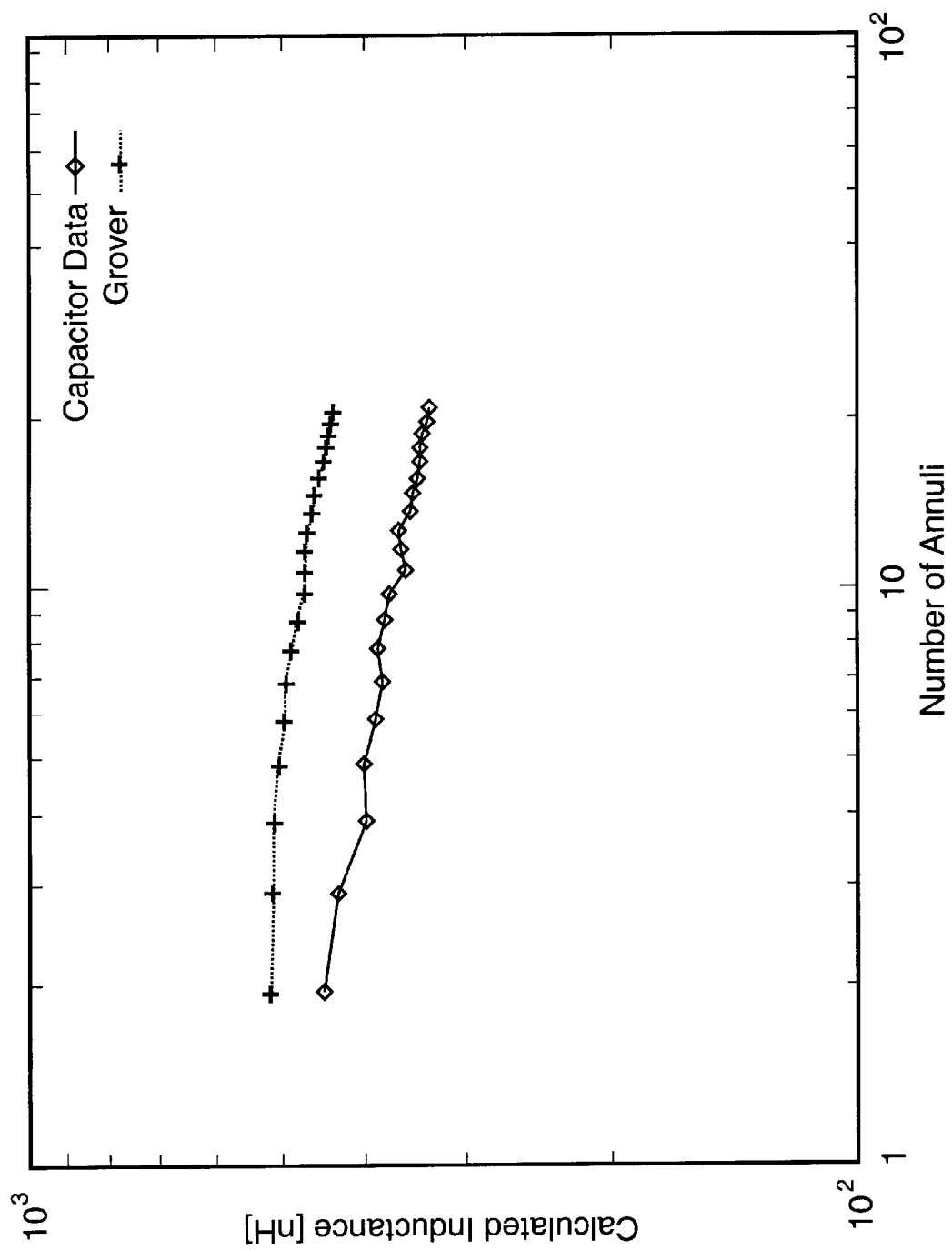
FIG. 5 is a plot of the inductance versus the number of conducting annuli.

A physically larger version of these capacitor/inductor devices was also constructed. The conducting elements of this last capacitor/inductor were manufactured from 5 mil (0. 127 mm) aluminum foil with an interior radius of 13.65 cm and an exterior radius of 23.22 cm. A section of each annulus was formed to accommodate the electrical connection required for a switch. The insulator between the conducting elements consisted of 20 sheets of 5 mil (0.127 mm) kraft paper for a total thickness of approximately 0.254 cm. The insulator had an interior radius of 13.02 cm. and an exterior radius of 23.5 cm. A gap 6.35-cm wide was cut into the kraft paper radially inward. The calculated value for each capacitance of this assembly is approximately 0.985 nF. Measurements of the effective capacitance and the effective resonant frequency of the device as additional annuli were added, are tabulated in Table 1 below. A plot of Inductance versus Number of Annuli data from Table 1 is shown in FIG. 5, along with a plot of the theoretical inductance calculated as per Grover (Frederick W. Grover, Inductance Calculations: Working Formulas and Tables, Dover, 1962). The experimental values and the theoretical values are in agreement on average within 104 nH.

TABLE 1

Experimental Data Obtained From a Capacitor/Inductor Device

| Number of Annuli | Measured Capacitance (nF) | Measured Frequency (MHz) | Calculated Inductance (nH) |
|---|---|---|---|
| 2 | 0.6585 | 9.26 | 448 |
| 3 | 1.474 | 6.33 | 429 |
| 4 | 2.270 | 5.32 | 394 |
| 5 | 3.139 | 4.50 | 398 |
| 6 | 3.936 | 4.08 | 386 |
| 7 | 4.786 | 3.75 | 377 |
| 8 | 5.728 | 3.40 | 382 |
| 9 | 6.219 | 3.31 | 372 |
| 10 | 7.120 | 3.11 | 369 |
| 11 | 8.385 | 2.92 | 353 |
| 12 | 9.212 | 2.78 | 356 |
| 13 | 10.033 | 2.65 | 360 |
| 14 | 10.783 | 2.60 | 348 |
| 15 | 11.582 | 2.52 | 346 |
| 16 | 12.793 | 2.41 | 341 |
| 17 | 13.392 | 2.37 | 338 |
| 18 | 14.361 | 2.29 | 338 |
| 19 | 14.952 | 2.25 | 336 |
| 20 | 16.022 | 2.19 | 331 |
| 21 | 19.653 | 1.98 | 329 |

Figure 6:
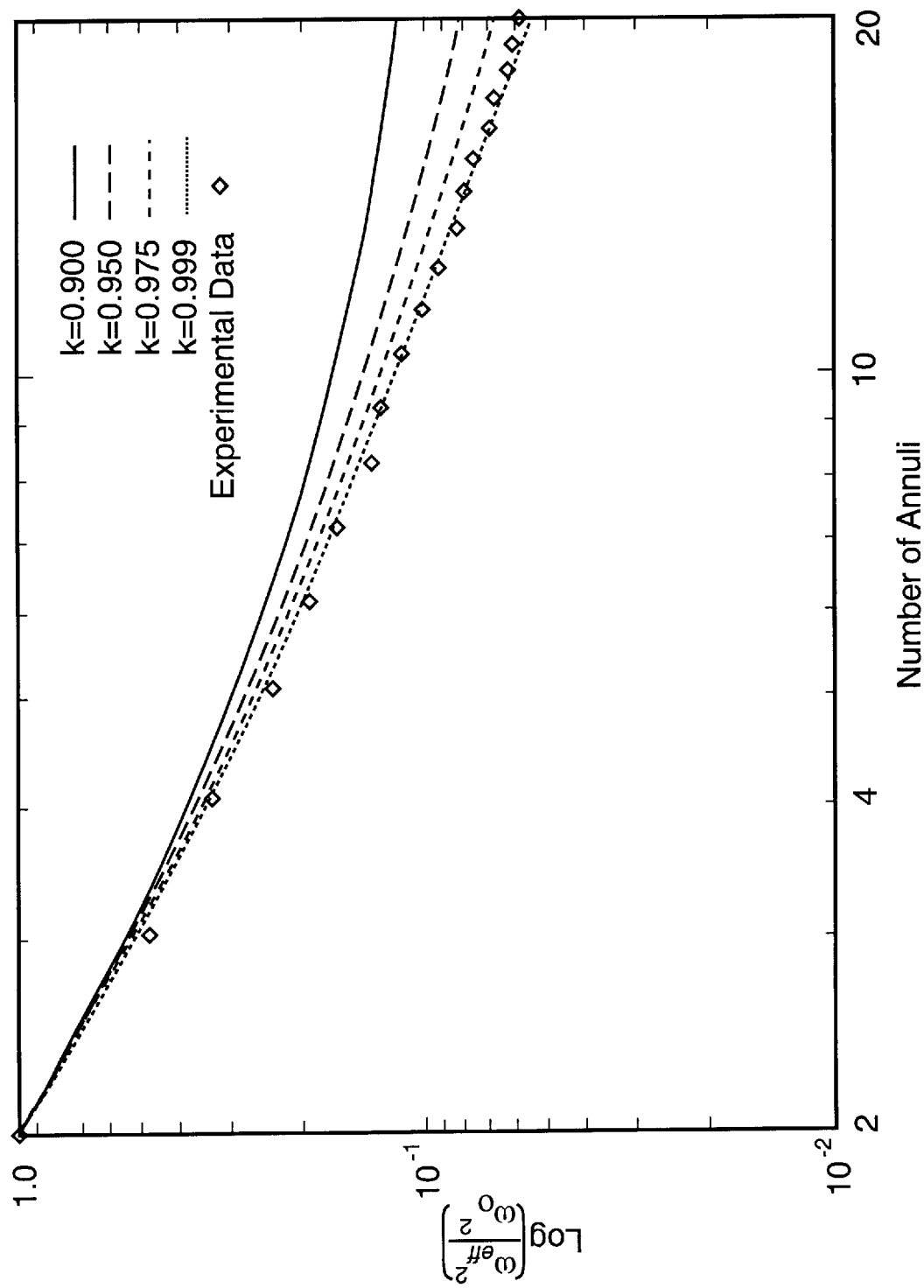
FIG. 6 is a semi-log plot of $$\frac{1-k}{1-k^{N-1}}$$

The 21 annuli listed in Table 1 form 20 capacitors. $C_p$ can be approximated by the average capacitance value yielded by the device in toto. Thus, $C_p$=(19.653 nF)/20=0.983 nF per capacitor. Set the resonant frequency for two annuli equal to $w_o$. Thus $\omega_o$=2π(9.26 MHz). $L_p$ may now be estimated as 300 nH. The measured resonant frequency produced by the device with each incremental plate is taken to be $\omega_{eff}$. For two plates $\omega_{eff}$=$\omega_o$. For three plates $$\omega_{eff} = \omega_O \sqrt{\frac{1-k}{1-k^{3-1}}} = \omega_O \sqrt{\frac{1}{1+k}},$$

as per Equation 8. A semi-log plot of $$\frac{1-k}{1-k^{N-1}}$$

versus the number of annuli, N, is shown in FIG. 6 for various values of the coupling coefficient, k. Also shown in FIG. 6 is a graph of $$\frac{\omega_{eff}^2}{\omega_O^2}$$

versus N.

A capacitor/inductor device was developed that merges the capacitance and inductor into a single component. Enhanced performance of this type of capacitor/inductor device can be achieved by utilization of the advanced construction techniques currently available in the capacitor industry. The represents a departure from the traditional method of construction of resonant circuits. However, the commonly used techniques as outlined in Grover still provide good estimates of the inductance values.

What is claimed is:

1. A composite capacitor/inductor resonant circuit comprised of:

a. a top conducting annulus;

b. a bottom conducting annulus;

c. an insulator annulus coaxially located between said top and said bottom conducting annuli to thereby electrically isolate said top and bottom conducting annuli and to thereby form a capacitor/inductor ring;

d. a gap circumferentially located in said capacitor/inductor ring having a first and a second side with said top conducting annulus extending down said first side of said gap and said bottom conducting annulus extending up said second side of said gap; and e. a switch connecting said top and said bottom conducting annuli.

2. A multi-ring composite capacitor/inductor resonant circuit comprised of:

a. a plurality of alternating layers of conducting annuli, said conducting annuli alternatively designated odd and even conducting annuli layers, separated by layers of insulating annuli coaxially positioned to form a stack;

b. a gap circumferentially located in said stack extending the length of said stack and having a first and a second side;

c. a first conductor electrically connecting said odd conducting annuli layers and extending down said first side of said gap;

d. a second conductor electrically connecting said even conducting annuli layers and extending down said second side of said gap; and e. a switch connecting said first conductor and said second conductor.

* * * * *